United States Patent [19]

Kim et al.

[11] 3,855,690

[45] Dec. 24, 1974

[54] APPLICATION OF FACET-GROWTH TO SELF-ALIGNED SCHOTTKY BARRIER GATE FIELD EFFECT TRANSISTORS

[75] Inventors: He B. Kim, Murrysville; Michael C. Driver, Trafford, both of Pa.

[73] Assignee: Westinghouse Electric Corporation, Pittsburgh, Pa.

[22] Filed: Dec. 26, 1972

[21] Appl. No.: 317,992

[52] U.S. Cl. ..................... 29/571, 29/578, 117/212, 117/213, 117/217, 148/175, 357/15, 357/23, 357/56, 357/60

[51] Int. Cl. ......... H01l 7/36, H01l 5/00, H01l 29/48

[58] Field of Search ...... 148/175; 29/571, 578, 579; 317/235 A, 235 B, 235 UA; 156/17; 117/212, 213, 217

[56] References Cited

UNITED STATES PATENTS

| | | | |
|---|---|---|---|
| 3,244,555 | 4/1966 | Adam et al. | 117/212 |
| 3,639,186 | 2/1972 | Forster et al. | 156/17 |
| 3,675,313 | 7/1972 | Driver et al. | 29/571 |
| 3,678,573 | 7/1972 | Driver | 29/571 |
| 3,746,908 | 7/1973 | Engeler | 317/235 N X |

OTHER PUBLICATIONS

Dumke et al., "GaAs Field–Effect Transistors with Self–Registered Gates," IBM Tech. Discl. Bull., Vol. 14, No. 4, Sept. 1971, p. 1248–1249.

Napoli et al., "Switching Times of.....GaAs Field–Effect Transistor," RCA Review, Vol. 32, Dec. 1971, p.645–649.

Shaw, D. W., "Selective Epitaxial Deposition of Gallium Arsenide in Holes," J. Electrochem. Soc., Vol. 113, No. 9, Sept. 1966, p. 904–908.

Tausch et al., "Novel Crystal Growth Phenomenon..-.GaAs...Silicon dioxide," J. Electrochem. Soc., Vol. 112, No. 7, July 1965, p. 706–709.

*Primary Examiner*—L. Dewayne Rutledge
*Assistant Examiner*—W. G. Saba
*Attorney, Agent, or Firm*—C. L. Menzemer

[57] ABSTRACT

A semiconductor device and particularly a self-aligned Schottky barrier gate field-effect transistor is made by epitaxial growth of facets corresponding to the source and drain regions on a surface of a semiconductor body through spaced apart preferably elongated windows in a masking layer and overgrowing edge portions of the masking layer at the windows to form overgrown portions on the facets. The channel region of the transistor is previously formed in the semiconductor body, preferably by epitaxial growth of a layer on a surface of a semiconductor body having a semi-insulating layer adjoining the surface. After removal of the masking layer, the Schottky barrier gate is self-aligned by deposition of metal on the unshielded portions of the planar surface between the facets.

8 Claims, 10 Drawing Figures

APPLICATION OF FACET-GROWTH TO SELF-ALIGNED SCHOTTKY BARRIER GATE FIELD EFFECT TRANSISTORS

FIELD OF THE INVENTION

The present invention relates to the making of semiconductor devices and particularly self-aligned Schottky barrier gate field-effect transistors (SAGFET).

BACKGROUND OF THE INVENTION

The making of many semiconductor devices such as the Schottky barrier gate field-effect transistors has required precision etching of a moat or the like in a semiconductor body. The need for a critically controlled etching step is often a major source of difficulty in maintaining quality control and high yields in production. Moreover, the etching step severely limits the geometry of the semiconductor device.

The Schottky barrier gate field-effect transistor is a solid state signal amplifying device whose operation depends on the control of current by an electric field. It works on the same principles and similar electrical characteristics as the standard junction field-effect transistor (JFET). It differs from the JFET in that the carrier depletion region and in turn gating electric field is formed in the conduction channel at least in part by a Schottky barrier rather than two PN junctions. This difference gives the Schottky barrier gate field-effect transistor electrical characteristics uniquely suited to certain applications such as high power, micro-wave amplifiers.

With the small geometries required by these devices and particularly those for high frequency applications, major problems are encountered with alignment and resolution during the fabrication process. Such devices require small source—drain contact spacings (e.g., 4 microns) with accurate alignment of the gate between them. The Schottky barrier contact cannot touch either the source or drain regions or ohmic contacts to those regions. Otherwise a low voltage breakdown or a short circuit will result. Self-alignment of the Schottky barrier contact is accomplished by vapor or sputter deposition of the barrier metal through a window in a metal mask layer corresponding to the ohmic contacts to the source and drain regions of the transistor. The mask layer has a cantilever shaped overhang adjacent the window that shields the surfaces of the channel beneath the overhang and prevents deposition of the metal in contact with those surfaces. The cantilevered metal overhang is formed by etching the semiconductor body through the window and undercutting the metal layer. See Proceedings of the IEEE, Vol. 59, pp. 1244–45 (August, 1971).

The main problem with the conventional method for making self-aligned Schottky barrier gate field-effect transistors is shaping the overhang structure by etching. In the etching step, the depth of the gate opening must be controlled to a fraction of a micron to retain a predetermined thickness of the channel layer corresponding to the desired electrical characteristics for the transistor. Further, the lateral undercut of the metal contact layer must be precisely controlled to provide sufficient overhang for self-alignment but yet avoid weakening and sagging of the metal layer with the resulting misalignment of the gate contact.

The present invention overcomes these difficulties and disadvantages. It involves no critical etching or metal deposition steps. The thickness of channel, source, and drain regions can be accurately predetermined and established. Further the Schottky barrier gate contact and the metal contacts to the source and drain can be formed simultaneously in the same metal deposition step.

SUMMARY OF THE INVENTION

A semiconductor device such as a self-aligned Schottky barrier gate field-effect transistor is made by epitaxially growing facets corresponding to the source and drain regions through spaced apart, preferably elongated, windows in a masking layer. The facets overgrow edge portions of the masking layer at the windows to form overgrown portions which, when the masking layer is removed, form a shield for the surrounding surface portions of the semiconductor body and provide for self-alignment of the Schottky barrier gate during vapor, sputter or equivalent deposition of a barrier contact metal.

A single crystal semiconductor body or wafer having a major surface and preferably an opposed major surface is provided. The body has at least first and second impurity regions of different conductivity that form an abrupt transition in impurity concentrations between impurity regions. One of the impurity regions, e.g., the second impurity region, adjoins the planar surface and forms the channel of the transistor while the other impurity region extends through the interior of the body and preferably adjoins the opposed major surface. The abrupt transition between the impurity regions may form a PN junction where the impurity regions are of opposite types of conductivity. Preferably however, the difference in conductivity is achieved by making one impurity region of low resistivity by high doping and the other impurity region of high resistivity either by very low doping, intrinsic growth, compensation doping, or proton bombardment, see IEEE Transactions on Electron Devices, Vol. ED–19, No. 5, p. 672 (May, 1972). In this connection, it is highly desirable that the channel region be the highly conductive region.

The semiconductor body may be any single crystal semiconductor material such as silicon, germanium or gallium arsenide. Gallium arsenide is preferred, however, for high frequency field-effect transistors because of the high carrier mobility of such material. Further, the conductivity of the impurity region may be chosen so that the transistor has either a N- or P- type channel. Again, for high carrier mobility, it is preferred that the transistor has an N-type channel and particularly where a gallium arsenide body is used.

Preferably the impurity regions of the semiconductor body are formed by epitaxial growth. A single crystal semiconductor body is provided which is intrinsic or has a given level of preferably compensating impurity concentration therethrough. The body is polished to form a planar major surface oriented along a lattice plane and preferably the (001) plane of the semiconductor crystal. The planar surface is then prepared, e.g., by etching, and a layer having a different impurity concentration level is grown on the planar surface to form a semiconductor body having first and second impurity regions—the first region corresponding to the original semiconductor body and the second region corresponding to the layer epitaxially grown on the planar surface. The layer corresponds to the desired dimensions and doping for the channel of the transistor.

The source and drain regions of the semiconductor device are provided by the epitaxial growth of facets through a masking layer. The masking layer is formed by vapor or sputter deposition and/or by heating the body in an oxidizing atmosphere. At least two spaced apart windows are formed in the masking layer by photolithographic or electron image projection techniques. The spacing between the windows is critical, corresponding to the desired length for the channel region of the transistor. After the exposed surfaces of the body at the windows are prepared, e.g., by etching, the facets are epitaxially grown from the surfaces through the windows. The facets are the same conductivity type and are preferably higher impurity concentration than the adjoining region of the body. The crystal growth is controlled so that the crystal overgrows the edge portions of the masking layer at the windows to form overgrown portions having a width greater than the window width. The masking layer is then removed by etching to leave the overgrown portions of the facets overhanging the surface portions of the semiconductor body.

The Schottky barrier gate contact and electrical contacts to the source and drain are subsequently formed. The Schottky barrier contact is formed on the planar surface between the facets by vapor or sputter deposition of a barrier metal. The overhangs or projections of the facets shield the portions of the planar surface adjacent the base of the facets so that the barrier contact is self-aligned and does not contact the drain or source regions or the metal contacts thereto. The electrical contacts to the source and drain regions are also formed by vapor or sputter deposition on the facets and, preferably, simultaneously with the formation of the Schottky barrier contact.

Other details, objects and advantages of the invention will become apparent as the following description of a present preferred embodiment and a present preferred method of practicing the same proceeds.

BRIEF DESCRIPTION OF THE DRAWINGS

In the accompanying drawings, the present preferred embodiments of the invention and the present preferred methods of practicing the invention are illustrated in which.

BRIEF DESCRIPTION OF THE PREFERRED EMBODIMENTS

Figure 1:
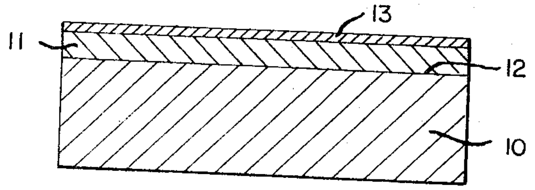
FIGS. 1, 2, 4 and 5 are cross-sectional views in elevation of a self-aligned Schottky barrier gate field-effect transistor at various stages of manufacture.

Referring to the drawings, substrate 10 is a single crystal semiconductor body or wafer of gallium arsenide. For formation of a microwave field-effect transistor as hereinafter described the substrate 10 is preferably a semi-insulating gallium arsenide doped with a compensating impurity such as chromium to provide high resistivity.

Layer 11 of N-type gallium arsenide corresponding to the channel of the field-effect transistor is formed on substrate 10. Substrate 10 is polished so that its major surface 12 is crystallographically oriented in the (001) lattice plane. Major surface 12 is etched, and layer 11 is subsequently epitaxially grown on surface 12. Preferably the etch and epitaxy growth is performed using the $AsCl_3/H_2$ vapor transport system described in "The Preparation of High Purity Gallium Arsenide by Vapour Phase Epitaxial Growth" by J. R. Knight, D. Effer and P. R. Evans, Solid-State Electronics, Vol. 8, pp. 178–180 (1965). Preferably the layer formed is of thickness 0.2 to 2 microns and impurity concentration between $5 \times 10^{14}/cm^3$ and $5 \times 10^{17}/cm^3$.

High temperature resistant masking layer 13 is thereafter formed over layer 11. Preferably layer 13 is of silicon oxide deposited, for example, by pyrolytic decomposition of monosilane ($SiH_4$) and oxygen, RF sputtering of quartz or possibly reactive sputtering of silicon in an oxidizing atmosphere. The thickness of masking layer preferably is between 2,000 and 4,000 Angstroms to provide for good facet overgrowth during subsequent processing.

Figure 2:
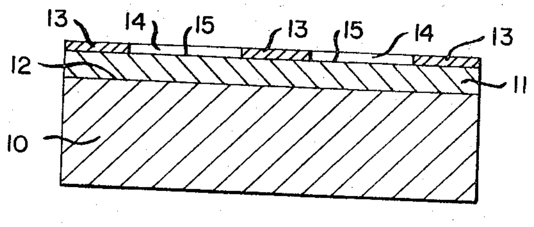

Referring to FIG. 2, spaced apart elongated windows 14 are formed in masking layer 13 to expose surfaces 15 of layer 11. Preferably windows 14 are formed by standard photolithographic and etch techniques. Surfaces 15 are formed as a result of the epitaxial growth of layer 11 on surface 12 and are therefore oriented in the (001) lattice plane.

The spacing between windows 14 is crucial to the electrical characteristics of the transistor and particularly for high frequency operation. The spacing corresponds to the distance between the source and drain of the transistor and may be as small as 1 micron for operating frequencies above 10 GHz. The minimum spacing is limited by the resolution of the photomask technique. For very small spacings, therefore, it may be appropriate to use the electron image projection system described in United States Applications Ser. Nos. 753,373 and 869,229, filed Aug. 19, 1968 and Oct. 24, 1969, respectively, and assigned to the same assignee as the present application.

Figures 3, 3A:
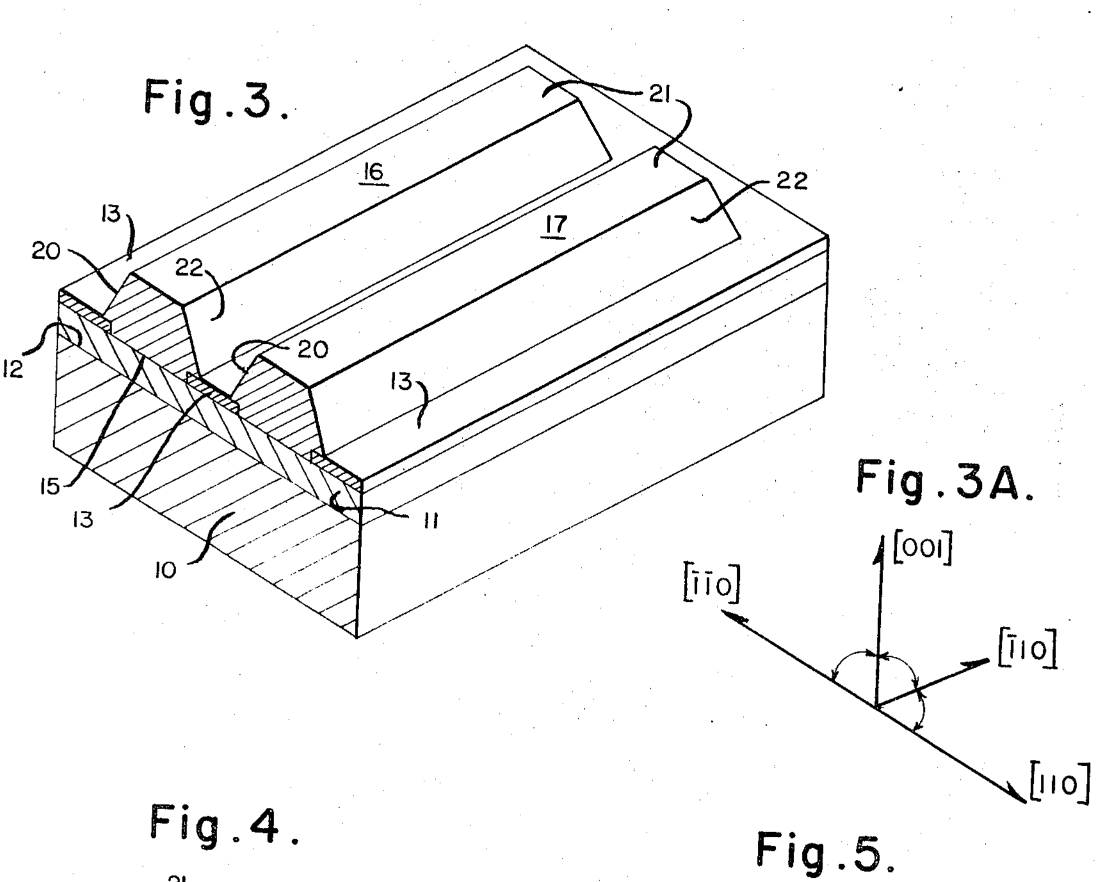
FIG. 3 is a cross-sectional view in perspective of a self-aligned Schottky barrier gate field-effect transistor at a stage in its manufacture after the facet growth.
FIG. 3A is a perspective view of a coordinate system showing the lattice plane orientation in the semiconductor material in FIG. 3.

Referring to FIG. 3, facets 16 and 17 corresponding to the source and drain of the transistor are epitaxially grown through windows 14 from surfaces 15. The surfaces 15 and facets 16 and 17 are grown by vapor epitaxy preferably using the same procedures and apparatus as used to grow layer 11. Preferably however, the N-type impurity concentration of the facets is greater than $1 \times 10^{18}/cm^3$ to provide low series resistance between the source and drain and the channel, and in turn higher current, higher gain, and higher frequency response from the transistor.

Preferably, the facets are grown to a thickness of from 2 to 4 microns. Lesser thicknesses do not provide for accurate, reliable self-alignment of the gate because the resulting overgrowth of the edge portion of masking layer 13 at the windows, as hereafter described, are too small. Greater thicknesses also cause difficulty in increasing the parasitic resistance in the transistor.

Figure 4:
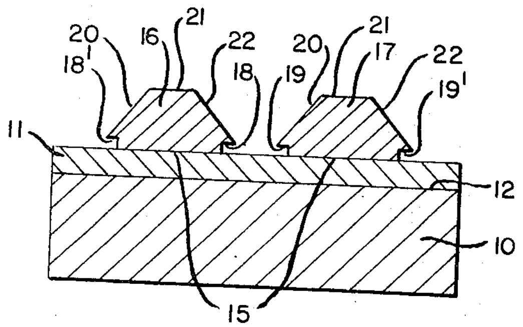

Referring to FIG. 4, the masking layer 13 is removed by etching techniques which do not attack the semiconductor material. The resulting semiconductor body has facets 16 and 17, each of which have overgrowths 18 and 18' and 19 and 19', respectively. The facets also have identically orientated lattice plane surfaces 20, 21 and 22 corresponding to lattice orientations ($\bar{1}\bar{1}1$), (001) and (111) respectively. The critical dimension as previously described is the spacing between overgrowths 18 and 19 which is controlled by the spacing of windows 14 and the extent of the epitaxial growth.

Figure 5:
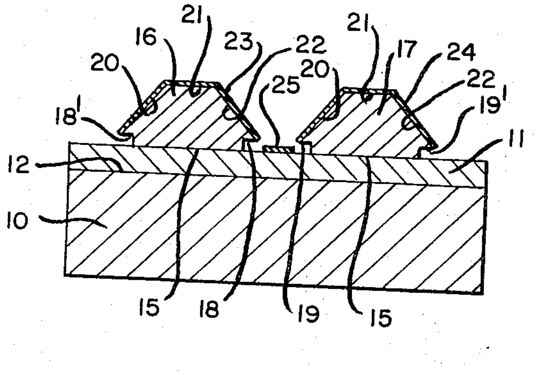
Figure 6:
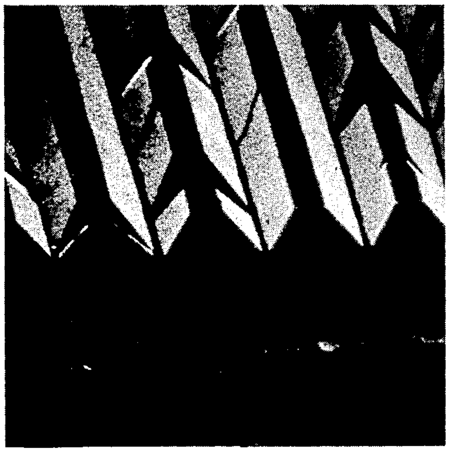
FIGS. 6 to 9 are scanning electron photomicrographs demonstrating the facet growth that would be used in forming a semiconductor device by the present invention.
Figure 7:
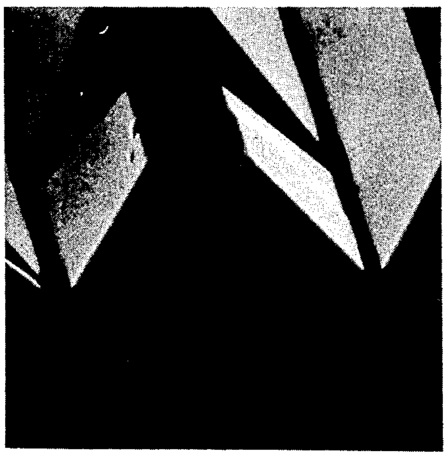
Figure 8:
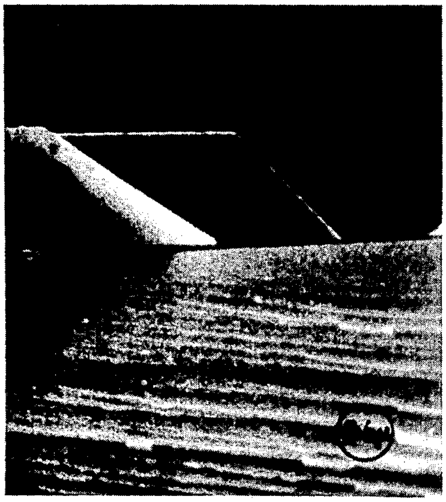
Figure 9:
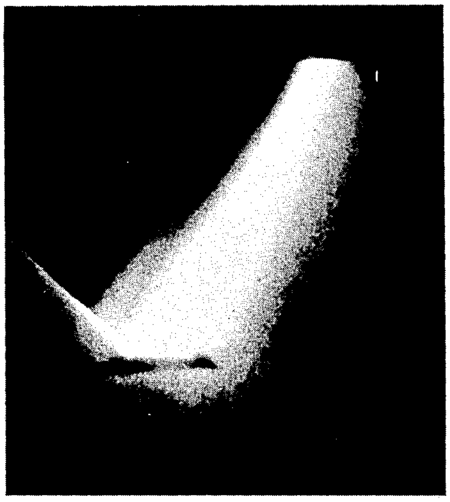

Referring to FIG. 5, the metal contacts 23 and 24 are provided on facets 16 and 17, respectively, and the Schottky barrier gate contact 25 is provided on layer 11. Preferably contacts 23, 24 and 25 are formed simultaneously by a standard metal vapor or sputter deposition technique. The metal chosen must be suitable for forming a Schottky barrier contact with layer 11 corresponding to the channel of the transistor, e.g., gold, gold-12% tantalum or gold-germanium on the gallium arsenide material. Contacts 23 and 24 may be either ohmic or Schottky barrier contacts because they are forward biased in operation and thence their capacitive reactance will cause an RF short circuit of the Schottky barrier. In any event, the self-alignment of the Schottky barrier gate is made possible by depositing the barrier metal through the window formed by overgrowths 18 and 19; the cantilever shaped overgrowths overhang and shield the surface portions of layer 11 immediately beneath the overgrowths and prevent gate-channel voltage breakdown and shorts with the source and/or drain and metal contacts on the source and drain.

The resulting self-aligned Schottky barrier gate field-effect transistor is shown in FIG. 5. The width of the devices is limited by the width over which the Schottky barrier gate can be uniformly formed. And since there is no alignment difficulties, the width can be several hundred microns. This leads to a high gain, power transistor capable of handling several watts at frequencies above 10 GHz.

To further illustrate the invention a prototype facet growth was made using the procedure set forth above. FIGS. 6 to 9 show scanning electron photomicrographs at various magnifications of facets similar to overgrowths 18 and 19. The resulting overhangs can clearly provide the shield for self-alignment of the Schottky barrier gate during the subsequent deposition step as described.

While the presently preferred embodiments of the invention and methods for performing them have been specifically described, it is distinctly understood that the invention may be otherwise variously embodied and used.

What is claimed is:

1. A method for making a self-aligned field-effect transistor comprising the steps of:

a. forming a masking layer having at least two spaced apart windows therethrough on a planar surface of a semiconductor body having two impurity regions therein of different conductivity forming an abrupt change in impurity concentrations between impurity regions and having one impurity region adjoining said planar surface;

b. epitaxially growing facets of the same conductivity type as the impurity region adjoining the planar surface from said surface through said windows and overgrowing edge portions of said masking layer at said windows to form overgrowth portions on said facets;

c. removing said masking layer to cause said overgrowth portions of said facets to overhang portions of the surface adjoining the facets and shield said portions of the surface against metal deposition;

d. depositing metal on the unshielded portions of the surface between the facets to form a self-aligned Schottky barrier contact to the surface; and e. depositing metal on the facets to make electrical contacts therewith.

2. A method for making a self-aligned field-effect transistor as set forth in claim 1 wherein:

the steps of depositing said Schottky barrier contact to the planar surface and depositing said electrical contacts to the facets are done simultaneously.

3. A method for making a self-aligned field-effect transistor as set forth in claim 1 wherein:

the impurity regions are formed in the semiconductor body by first providing a semiconductor body with a given level of impurity therethrough, polishing said semiconductor body along a lattice plane of said body to form said planar surface, and epitaxially growing a layer with an impurity concentration of different conductivity from said body on said planar surface.

4. A method for making a self-aligned field-effect transistor as set forth in claim 3 wherein:

said polishing is done along the (001) lattice plane of the semiconductor body.

5. A method for making a self-aligned field-effect transistor of gallium arsenide comprising the steps of:

a. forming a semi-insulating semiconductor body of gallium arsenide;

b. polishing said semiconductor body along a lattice plane to form a planar surface on said body;

c. epitaxially growing a layer on said planar surface having an N-type impurity concentration between $5 \times 10^{14}$ and $5 \times 10^{17}/cm^3$;

d. forming a masking layer on said epitaxially grown layer having spaced apart windows therethrough;

e. epitaxially growing facets of the same semiconductivity as the epitaxially grown layer with an impurity concentration of greater than $1 \times 10^{18}/cm^3$ through said windows and overgrowing edge portions of said masking layer at said windows to form overgrowth portions on said facets;

f. removing said masking layer to cause said overgrowth portions of said facets to overhang portions of said planar surface adjoining the facets and shield said portions of the planar surface against metal deposition;

g. depositing metal on the unshielded portions of the planar surface between the facets to form a Schottky barrier contact to the planar surface; and h. depositing metal on the facets to make electrical contacts therewith.

6. A method for making self-aligned field-effect transistors as set forth in claim 5 wherein:

said facets are epitaxially grown to a thickness between 2 and 4 microns.

7. A method for making self-aligned field-effect transistors as set forth in claim 5 wherein:

the steps of depositing said Schottky barrier contact to the planar surface and depositing said electrical contacts to the facets are done simultaneously.

8. A method for making self-aligned field-effect transistors as set forth in claim 5 wherein:

said masking layer is between about 2,000 and 4,000 Angstroms in thickness.

* * * * *